United States Patent
Chen et al.

[11] Patent Number: 6,084,446
[45] Date of Patent: Jul. 4, 2000

[54] POWER ON RESET CIRCUIT

[75] Inventors: Han-Sung Chen, Keelung; Tzeng-Huei Shiau, Hsin-Pu, both of Taiwan; Ray-Lin Wan, Fremont, Calif.

[73] Assignee: Macronix International Co., Ltd., Hsinchu, Taiwan

[21] Appl. No.: 09/101,679
[22] PCT Filed: Mar. 30, 1998
[86] PCT No.: PCT/US98/06255
  § 371 Date: Jun. 12, 1998
  § 102(e) Date: Jun. 12, 1998
[87] PCT Pub. No.: WO99/50962
  PCT Pub. Date: Oct. 7, 1999

[51] Int. Cl.[7] .................................................. H03K 17/22
[52] U.S. Cl. ............................................................ 327/143
[58] Field of Search ...................................... 327/143, 198

[56] References Cited

U.S. PATENT DOCUMENTS

| | | | |
|---|---|---|---|
| 5,345,424 | 9/1994 | Landgraf | 365/227 |
| 5,528,182 | 6/1996 | Yokosawa | 327/143 |
| 5,638,330 | 6/1997 | Confalonieri et al. | 365/189.09 |
| 5,646,902 | 7/1997 | Park | 365/227 |
| 5,734,281 | 3/1998 | Morishawa et al. | 327/143 |

*Primary Examiner*—Terry D. Cunningham
*Attorney, Agent, or Firm*—Mark A. Haynes; Haynes & Beffel LLP

[57] ABSTRACT

A circuit generates a power on reset signal in response to the changing of a supply potential across a supply node and a reference node from a power down level to a power on level. The circuit comprises a capacitor having a first terminal coupled to the supply node and a second terminal. An output driver, such as an inverter, is coupled between the supply node and the reference node. The output driver has an output coupled to the second terminal of the capacitor. An input driver comprises a circuit which drives the input of the output driver to a level which tracks changes in the supply potential. A clamp transistor, such as a n-channel MOS transistor having a lower threshold than normal transistors in the circuit, is coupled between the input of the output driver and the supply potential. The clamp transistor clamps the input of the output driver to a driver ready level which is below the trip point of the output driver when the supply potential is at a power down level. In addition, a feedback transistor is included, which has a gate coupled to the output of the output driver, a drain coupled to the input of the output driver, and a source coupled to the supply node. The feedback transistor pulls the input of the output driver to a driver off level above the trip point of the output driver.

10 Claims, 4 Drawing Sheets

M10 : WEAK DEVICE WITH LOWER Vt

POWER ON RESET CIRCUIT

BACKGROUND OF THE INVENTION

1. Field of the Invention

The present invention relates to power on reset circuitry. More specifically, the present invention provides a power on reset circuit which is operable with low leakage current and high reliability.

2. Description of Related Art

Power on reset circuits are used in integrated circuits to generate a reset signal, when the power supply voltage reaches an operating level. For example, in U.S. Pat. No. 5,345,424, a power on reset circuit is illustrated in FIG. 3. One disadvantage of the circuit described in U.S. Pat. No. 5,345,424 arises because of DC leakage current occurs through the circuit when the power is on. As low power integrated circuits are becoming more important, this DC leakage is unacceptable.

One alternative approach used in prior art integrated circuits is illustrated in FIG. 1. The circuit includes an input driver composed of transistors M1–M5. This input driver drives a voltage at node 1 on the input of an inverter formed by transistors M7 and M8. A clamp transistor M6 is connected between the input of the inverter and the supply potential. A capacitor formed by transistor M9 is connected between the supply potential and the output of the inverter formed by transistors M7 and M8. The capacitor connected transistor M9 serves to couple the output of the inverter to the level of the supply potential, until the voltage at the input of the inverter reaches the trigger point of transistor M8. When M8 turns on, the capacitor is discharged to ground. Thus, during a power up sequence, the output of the inverter is pulled up as the supply potential increases. After the voltage at node 1 reaches the turn on potential of transistor M8, the pulse being formed by the pull up of node 2 is ended. That pulse is translated by the buffer composed of the two invertors in series into a power on reset signal. Transistor M6 serves to clamp the input of the inverter formed by transistors M7 and M8 to a level near the supply potential during a power down sequence. Thus, node 1 cannot increase more than the threshold of transistor M6 above the supply potential when the supply potential approaches ground. In this way, node 1 is low enough during a subsequent power up sequence to ensure that the inverter has an input below the trip point of transistor M8, allowing the capacitive coupling across transistor M9 to work in the formation of the power on pulse. This circuit however suffers the disadvantage that the input of the inverter (labeled node 1) is not driven to the level of the supply potential during normal operation of the circuit. This causes leakage current through transistor M7, which is unacceptable for low power devices.

Another disadvantage of the circuit of FIG. 1 occurs because the power down level may not reach all the way to ground. If the final power down level is about 0.5 volts, and the threshold of the clamp transistor M6 is about 0.8 volts, then it is possible that node 1 will be higher than the trip point of transistor M8 when the next power up sequence occurs. Under these conditions, transistor M8 discharges the capacitor at the output of the inverter while the supply potential is ramping up. No power on pulse is generated in this case.

FIG. 2 illustrates an improved circuit, also used in the prior art. According to the embodiment of FIG. 2, an additional low threshold transistor M10 is connected between the input of the inverter formed by transistors M7 and M8 and ground. The low threshold transistor M10 ensures that the voltage on the input of the inverter is pulled down to about 0.6 volts, that is the threshold of transistor M10, which is lower than the threshold of transistor M8 during the power down condition. This ensures that the circuit will operate during a power down condition in which the supply potential does not fall all the way to ground. However, the circuit of FIG. 2 still suffers the disadvantage that the potential at node 1 on the input of the inverter formed by transistors M7 and M8 does not reach the supply potential during normal operation. This allows leakage current through transistor M7, which is unacceptable.

Accordingly, it is desirable to provide an improved power on reset circuit which operates reliably even when the supply potential does not drop all the way to ground between power up cycles, and which does not suffer leakage current.

SUMMARY OF THE INVENTION

The present invention provides a power on reset circuit which solves the undesired DC leakage current problem and operates even when the supply potential does not fall all the way to ground.

Accordingly, the present invention provides a circuit for generating a power on reset signal in response to the changing of a supply potential across a supply node and a reference node from a power down level to a power on level. The circuit comprises a capacitor having a first terminal coupled to the supply node and a second terminal. An output driver, such as an inverter, is coupled between the supply node and the reference node. The output driver has an input, and an output which is coupled to the second terminal of the capacitor.

The output driver includes a first transistor, such as a first n-channel MOS transistor having a first threshold above which the first transistor is on, and below which the first transistor is off. The threshold of the first transistor is set at a level higher than that of other transistors in the circuit. The gate of the first transistor is connected to the input of the output driver. The drain of the first transistor is connected to the output of the output driver, and the source of the first transistor is coupled to the reference node. Thus, the output is pulled to a reference node voltage when the input is above the first threshold. The output driver includes a second transistor, such as a p-channel MOS transistor having a second threshold above which the second transistor is off, and below which the second transistor is on. The gate of the second transistor is coupled to the input of the output driver. The drain of the second transistor is coupled to the output of the output driver. The source of the second transistor is coupled to the supply node. Thus, the second transistor pulls the output of the output driver to a supply node voltage when the input of the output driver is below the second threshold.

An input driver is coupled to the input of the output driver. It comprises a circuit which drives the input of the output driver to a level which tracks changes in the supply potential.

A clamp transistor, such as a n-channel MOS transistor having in one embodiment a threshold lower than or equal to normal transistors in the circuit, is coupled between the input of the output driver and the supply potential. The clamp transistor clamps the input of the output driver to a driver ready level which is below the first threshold of the first transistor in the output driver when the supply potential is at a power down level.

In addition, a feedback transistor is included, such as a p-channel MOS transistor having a threshold, for example, lower than the threshold of the second transistor. The feedback transistor has a gate coupled to the output of the output driver, a drain coupled to the input of the output driver, and a source coupled to the supply node. The feedback transistor pulls the input of the output driver to a driver off level above the second threshold when the output of the output driver is below the threshold of the feedback transistor.

In one implementation, the clamp transistor has a threshold which is at least one volt lower than the threshold of the first transistor in the output driver. In this way, a power down level comprises a greater range, for example about 1 volt to ground, in which the safe operation of the power on reset circuit can be assured. Also, during intervals in which the supply potential is on, the feedback transistor maintains the input of the output driver at a level higher than the turn on threshold of the second transistor in the output driver. This insures that no leakage current flows through the output driver.

According to another aspect of the present invention, the input driver includes a capacitor having a first terminal coupled to the input of the output driver, and a second terminal coupled to the reference node. A pass transistor is connected from the input of the output driver to a gate and a drain of a p-channel transistor and a source and gate of a n-channel transistor. The source of the p-channel transistor and the drain of the n-channel transistor are coupled to the supply node.

According to another aspect of the invention, the output of the output driver is coupled through a buffer which translates the pulse generated on the output to a signal having a magnitude near the supply potential. Thus, the buffer comprises an inverter which switches from the supply potential to ground in response to the pulse. In another embodiment, a second inverter is included to change the polarity of the power on reset signal.

Other aspects and advantages of the present invention can be seen upon review of the figures, the detailed description and the claims which follow.

DETAILED DESCRIPTION

Figure 1:
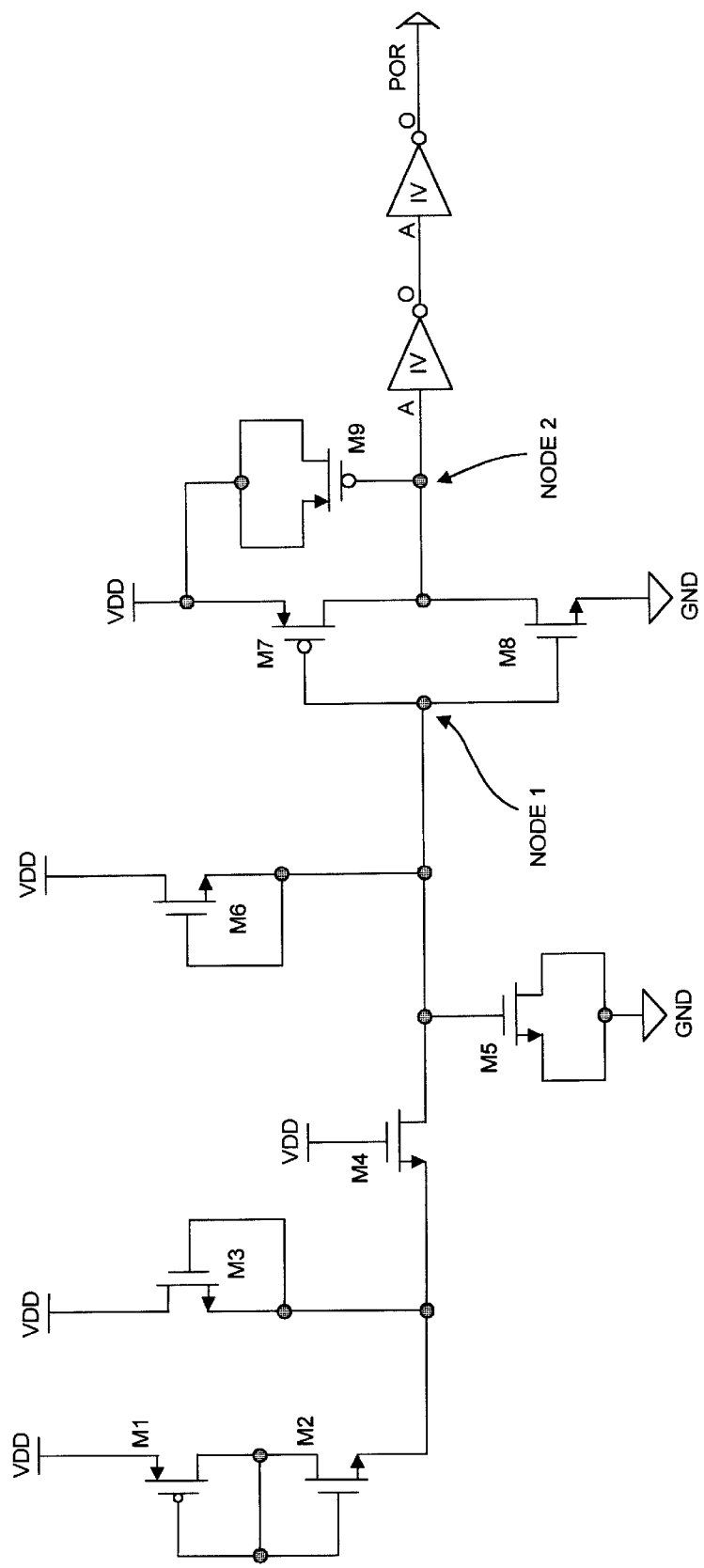
FIG. 1 is a circuit diagram of prior art power on reset circuit.
Figure 2:
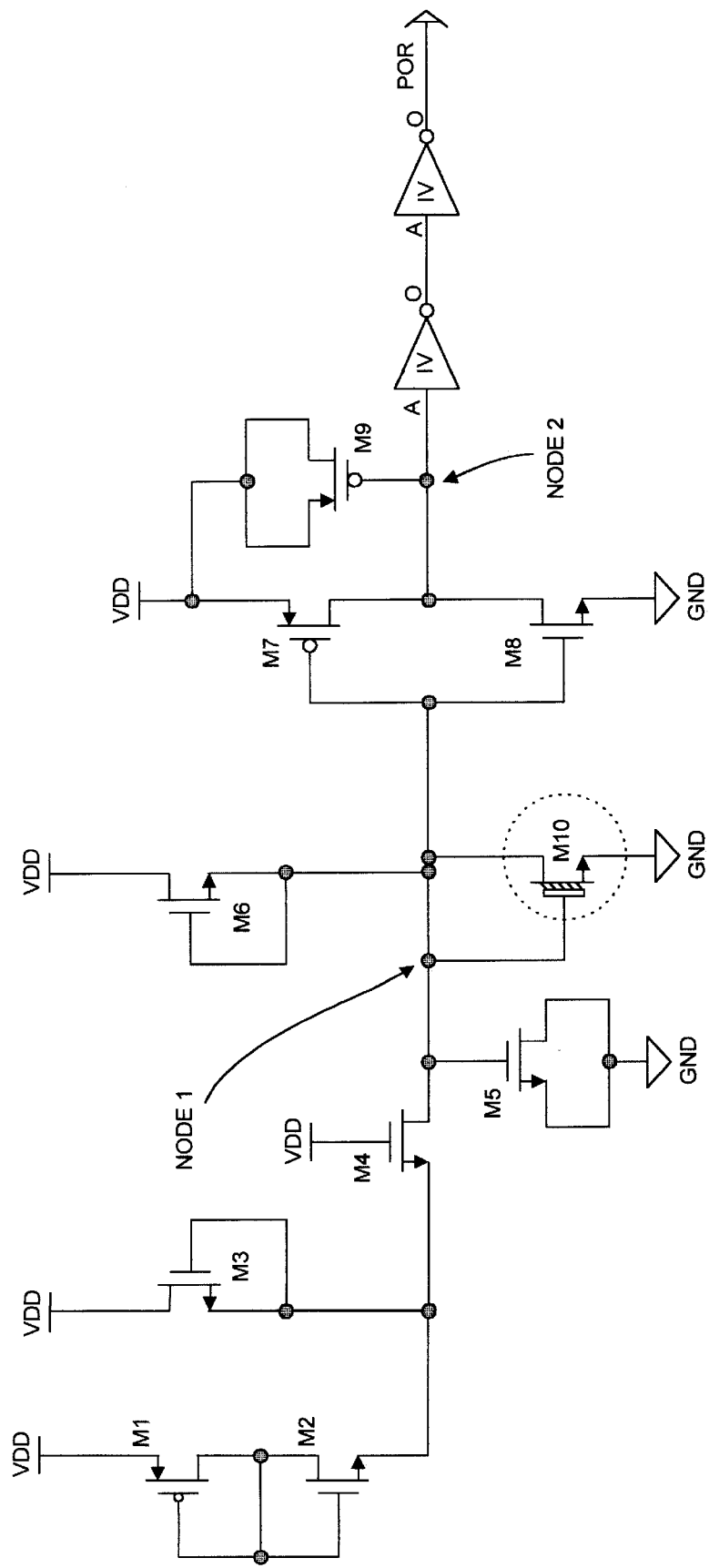
FIG. 2 is a circuit diagram of another prior art power on reset circuit.

A detailed description of the present invention is provided with respect to FIGS. 3 and 4A–4C. FIGS. 1 and 2 have been described above in connection with background of the invention.

Figure 3:
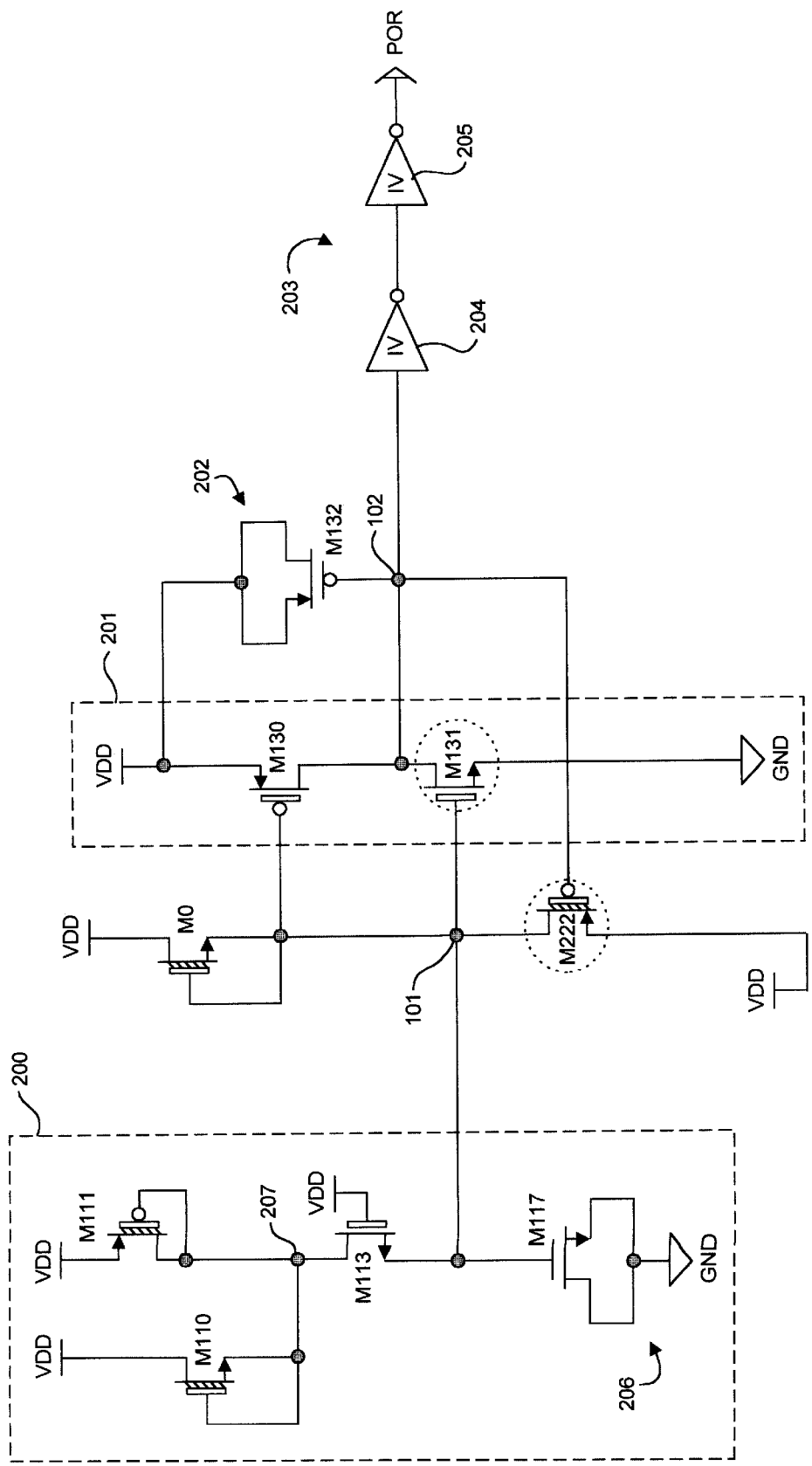
FIG. 3 is a circuit diagram of a power on reset circuit according to the present invention.

FIG. 3 is a circuit diagram of a preferred implementation of a power on reset circuit according to the present invention. Generally, the circuit includes an input driver 200, an output driver 201, a capacitor 202 implemented by transistor M132, a feedback transistor M222, and a clamp transistor M0. The output driver 201 has an output node 102, and an input node 101. A pulse is generated at the output node 102 which is supplied as an input to a buffer generally 203, which includes inverter 204 and inverter 205 in series.

The input driver 200 serves to cause node 101 to track changes in the supply potential VDD. The input driver in this embodiment comprises a capacitor 206 implemented by n-channel MOS transistor M117 which has its gate connected to node 101, and its source and drain connected to reference node, which in this example is ground. The input driver 200 also includes a pass transistor M113 which has its source connected to node 101, its gate connected to the supply node VDD, and its drain connected to node 207. An n-channel MOS transistor M110 has its source and gate connected to node 207, and its drain connected to the supply node VDD. A p-channel MOS transistor M111 has its gate and drain connected to node 207, and its source connected to the supply node VDD. The n-channel MOS transistors M117 and M113 are implemented on the device so that they have the same threshold as logic circuits on the integrated circuit on which the device is to be implemented in this example. Thus for example the gate to source threshold voltage of such transistors is about 0.8 volts. The n-channel MOS transistor M110 in this example has a lighter channel doping concentration, referred to as native mode, so that its gate to source threshold is less than the standard threshold. Thus for example, the gate to source threshold of transistor M110 in this example is about 0.4 volts. Likewise the p-channel transistor M111 has a threshold different from the threshold of standard p-channel transistors in the device. The standard p-channel transistor (such as transistor M130) in the device in this example has a threshold of about −0.9 volts, whereas the gate-to-source threshold of transistor M111 is about −1.2 volts.

The output driver 201 consists of p-channel transistor M130 and n-channel MOS transistor M131. The n-channel MOS transistor M131 in the preferred embodiment has an increased gate-to-source threshold voltage such as about 1.8 volts by implanting additional p-type dopant in the channel. Transistor M131 has its source connected to the reference node ground, and its drain connected to the output node 102. The gate of transistor M131 is connected to the input node 101. Transistor M130 is a standard threshold p-channel MOS transistor having its drain connected to the output node 102 and its source connected to the supply node VDD. The gate of transistor M130 is connected to the input node 101.

Transistor M0 is a clamp transistor having its source and gate connected to node 101, and its drain connected to the supply node VDD. The threshold of transistor M0 is a low threshold in this example, such as about 0.4 volts, and preferably at least 1 volt lower than the threshold of transistor M131. Typically, transistor M0 will have a threshold lower than or equal to that of standard n-channel transistors on the chip.

The feedback transistor M222 is a p-channel MOS transistor having its gate connected to the output node 102, its drain connected to the input node 101, and its source connected to the supply node VDD. Transistor M222 has a gate-to-source threshold near −1.2 volts. In alternative circuits, transistor M222 has a threshold equal to standard p-channel transistors on the chip.

Finally, the capacitor 202 consists of a p-channel MOS transistor M132 having its source and drain connected to the supply node VDD, and its gate connected to the output node 102.

Figure 4A:
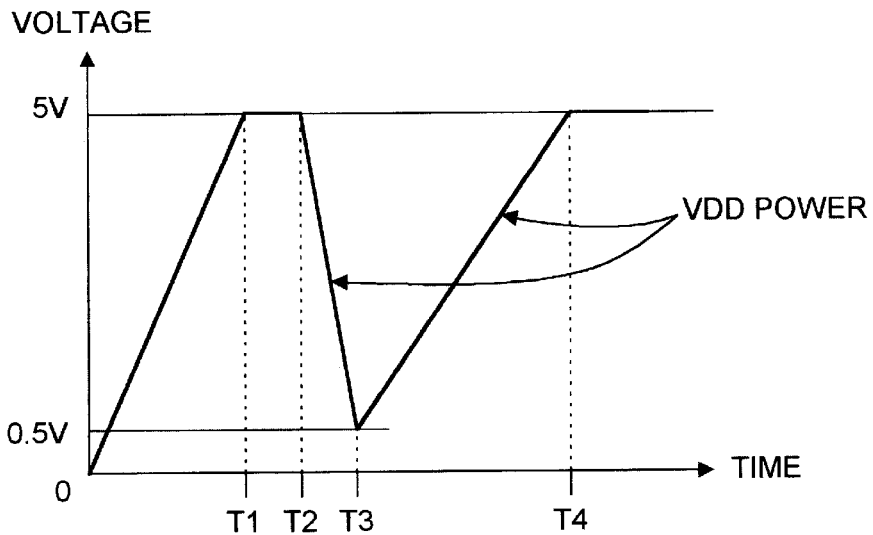
FIGS. 4A–4C are graphs illustrating the voltage versus time of various nodes in the circuit of FIG. 3.
Figure 4B:
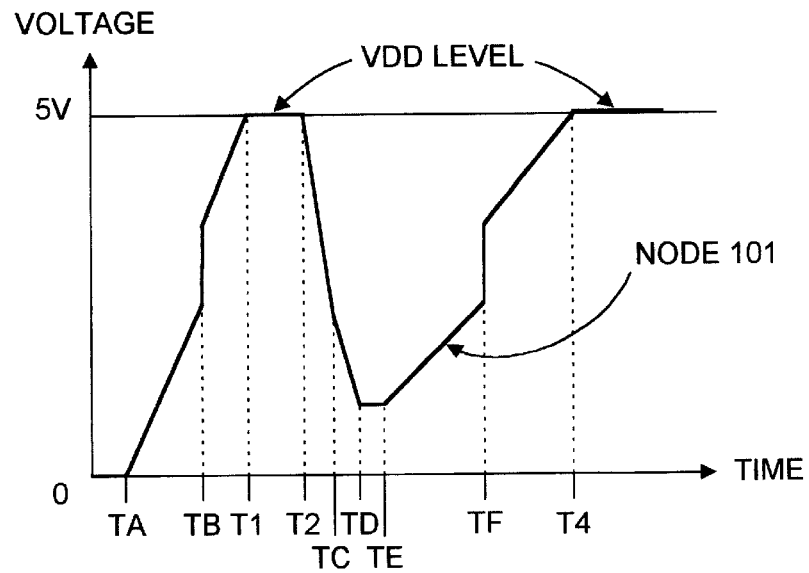
Figure 4C:
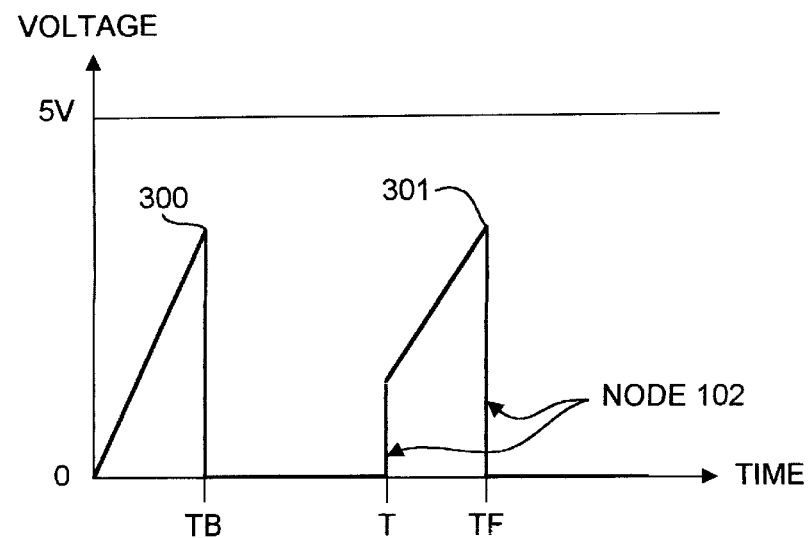

Operation of the circuit of FIG. 3 can be understood with reference to FIGS. 4A–4C. FIG. 4A illustrates a voltage versus time trace for the supply node VDD illustrating a power up sequence followed by a power down sequence which results in a lowest voltage of about 0.5 volts, followed by another power up sequence. FIG. 4B provides a voltage versus time trace for the voltage at node 101 at the input of the output driver in FIG. 3. FIG. 4C provides the voltage versus time trace for the signal at node 102 at the output of the output driver in FIG. 3.

As can be seen in FIG. 4A, for this example the voltage at the supply node VDD ramps from zero volts at time zero (0) to about 5 at time T1. At time T2, the supply node voltage VDD begins to fall until time T3 to a level of about 0.5 volts in this example. At time T3, the voltage increases again until time T4 where it reaches the supply potential of about 5 volts.

FIG. 4B illustrates the voltage at node 101. The times T1–T4 are labeled on the graph. With the voltage at node 101 beginning at zero volts at time zero, it remains at zero volts until time TA. At time TA, transistor M111 turns on enabling the transistors in M113 and M117 to drive node 101 at a level which is about 1 threshold voltage below the supply potential. An RC delay is defined by the channel resistance of transistor M113 and the gate capacitance of transistor M117. At time TB, node 101 reaches the threshold of transistor 131. Transistor 131 turns on, causing the voltage at node 102 to fall below the threshold voltage of transistor M222. Transistor M222 turns on, and pulls node 101 to the supply potential level. Node 101 then tracks the supply potential to time T1, and at time T2 begins to fall with the power down sequence until time TC. Node 101 follows the supply potential through transistor M222 to about 1.2 volts, when M222 turns off. Thus at time TC, the transistor M131 turns off because the voltage at node 101 falls below its threshold. When transistor M222 is off, and the supply potential drops below about 0.8 volts, node 101 begins to track the supply potential through transistor M0 until time TD, corresponding to time T3 in FIG. 4A. The node 101 then follows the supply potential through the clamp transistor M0 with about 1 threshold voltage difference of about 0.4 volts in this example. The low threshold of transistor M0 provides additional low VCC operation, which may not be necessary in a given embodiment. When the supply potential begins to rise at time TD, node 101 will begin to track the supply potential at time TE, and continue to rise until time TF when the trip point of transistor M131 is reached. This causes the output node to fall to ground, and turns on the feedback transistor M222, pulling the level of node 101 to the level of the supply potential. Node 101 tracks the voltage at the supply node until time T4 and levels out at the VDD level.

FIG. 4C illustrates the voltage of the output node 102. The output node follows the supply potential from time T0 to time TB when transistor 131 turns on. This occurs because of the capacitive coupling across transistor M132 between the output node 102 and the supply node VDD. When transistor 131 turns on, the voltage at the output node 102 is pulled down to the ground potential through transistor M131. Output node remains at the ground potential until time TC when transistor M131 turns off. At this time, it begins to rise with the supply potential because of the capacitive coupling. The voltage at the output node 102 is pulled back down to the ground potential at time TF when transistor 131 turns on again.

The pulses 300 and 301 generated at node 102 in the circuit of FIG. 3 are supplied as inputs to the buffer 203. The buffer 203 includes a first inverter 204 which translates the pulse 300 into a supply voltage level signal, switching the output of the inverter 204 from a VDD level to a ground level. A second inverter 205 is utilized to switch the polarity of the power on reset signal as appropriate.

The sequence of events illustrated in FIGS. 4A–4C demonstrate that the circuit described in FIG. 3 is insured to reach a state in which transistor M131 is off in a power down sequence, even if that power down sequence does not reach all the way to the ground potential.

Similarly, the present invention demonstrates that leakage current during a power on condition is stopped by the action of transistor M222, which at time TB and time TF drive the input of the output driver to the supply potential VDD. This turns off transistor M130 and prevents leakage current.

Accordingly, the present invention provides a solution to the undesired DC leakage current of prior art systems. In particular, the p-type device M222 having its gate to source threshold voltage of about −1.2 volts in a preferred embodiment is used as a feedback device whose gate is connected to the output and source and drain are connected to the supply potential and the input of the output driver respectively. In alternative embodiments, a standard threshold transistor may be used in place of transistor M222. The function of the feedback transistor with a special threshold voltage is when VDD rise very slowly during power-up period, the node 102 in FIG. 3 is possibly not coupled up to VDD. In this condition, the node 102 in FIG. 3 is still charged up to VDD in turn off device M222 in FIG. 3 if the threshold voltage of device M222 (Vt=−1.2 v) in FIG. 3 is lower than the threshold voltage device M130 (Vt=−0.8 v) in FIG. 3. But this condition may rarely happen. So the feedback transistor does not need a special threshold voltage in some embodiments. During power up, as the input to the output driver reaches the trigger point of transistor M131, and turns on transistor M131, the output is driven to ground, and the voltage at the input of the output driver will continue to rise to the supply potential through transistor M222. As a result, undesired leakage is removed because transistor M130 is turned off completely.

Second, the n-channel MOS transistor M8 of FIG. 2 is replaced in the present invention by an ultrahigh threshold n-channel transistor M131 having a threshold of about 1.8 volts. In addition, the transistor M6 of FIG. 2 is replaced by a low threshold n-channel MOS transistor M0 having a threshold of about 0.4 volts. In this way, when the supply potential falls to about 1 volt, the voltage at the input of the output driver will follow the supply potential down to approximately 1.2 volts until device M222 is off. If the supply potential continues to fall below 1.2 volts, then node 1 follows the supply potential through transistor M0, with a difference of about the threshold of transistor M0 higher than the supply potential. In any event, transistor M131 is off. In the next power up cycle, the reset signal will be activated because transistor M131 has been turned off during the early power down period.

It is important to enable the circuit to generate a power on reset signal when the supply potential reaches about 1 volt because logic circuits on an integrated circuit with which the present invention is utilized may have a threshold of about +/−0.8 volts. Thus, as the supply potential drops below 1 volt, the logic circuit will cease to work. Above 1 volt, the logic circuits of the integrated circuit may continue to work and a reset condition may not be necessary.

Accordingly, the present invention provides an improved power on reset signal suitable for use in integrated circuits, with very low leakage current, and high reliability.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A circuit to generate a power on signal in response to changing of a supply potential across a supply node and a reference node, from a power down level to a power on level, comprising:

a capacitor having a first terminal coupled to the supply node, and a second terminal;

an output driver coupled between the supply node and the reference node, and having an input and an output coupled to the second terminal of the capacitor, the output driver including a first transistor having a first threshold, and having a gate coupled to the input, a drain coupled to the output, and a source coupled to the reference node through which the output is pulled to a reference node voltage when the input is above the first threshold, and a second transistor having a second threshold, and having a gate coupled to the input, a drain coupled to the output, and a source coupled to the supply node through which the output is pulled to a supply node voltage when the input is below the second threshold; and an input driver coupled between the supply node and the input to the output driver, the input driver comprising a circuit which tracks changes in the supply potential;

a clamp transistor having a gate and source coupled to the input of the output driver and a drain coupled to the supply node, the clamp transistor having a clamp transistor threshold, which clamps the input to the output driver at a driver-ready level below the first threshold when the supply potential is at the power down level; and a feedback transistor having a gate coupled to the output of the output driver, a drain coupled to the input of the output driver, and a source coupled to the supply node, and having a feedback transistor threshold, which pulls the input of the output driver to a driver-off level above the second threshold when the output of the output driver is below the feedback transistor threshold.

2. The circuit of claim 1, wherein the capacitor comprises a p-channel MOS transistor, having a drain and a source coupled to the supply node, and a gate coupled to the output.

3. The circuit of claim 1, wherein the first transistor comprises an n-channel MOS transistor, and the clamp transistor comprises an n-channel MOS transistor, and wherein the first threshold is higher than the clamp transistor threshold.

4. The circuit of claim 1, wherein the first threshold is greater than a sum of 1 volt and the clamp transistor threshold.

5. The circuit of claim 1, wherein the feedback transistor comprises a p-channel MOS transistor, and wherein the feedback transistor threshold is greater than the second threshold.

6. The circuit of claim 1, wherein the input driver comprises:

a capacitor having a first terminal coupled to the input of the output driver, and a second terminal coupled to the reference node;

a pass transistor, having a gate coupled to the supply node, a source coupled to the input of the output driver, and a drain;

a p-channel transistor having a gate and a drain coupled to the drain of the pass transistor, and a source coupled to the supply node; and a n-channel transistor having a gate and a source coupled to the drain of the pass transistor, and a drain coupled to the supply node.

7. The circuit of claim 1, wherein the power down level comprises a range from about 1 volt to ground.

8. The circuit of claim 1, including:

a buffer coupled to the output of the output driver which converts a pulse on the output to a signal having a magnitude near the supply potential.

9. The circuit of claim 8, wherein the buffer comprises an inverter having an input coupled to the output of the output driver.

10. A circuit to generate a power on signal in response to changing of a supply potential across a supply node and a reference node, from a power down level to a power on level, comprising:

a capacitor having a first terminal coupled to the supply node, and a second terminal;

an output driver coupled between the supply node and the reference node, and having an input and an output coupled to the second terminal of the capacitor, the output driver including a first n-channel MOS transistor having a first threshold, and having a gate coupled to the input, a drain coupled to the output, and a source coupled to the reference node through which the output is pulled to a reference node voltage when the input is above the first threshold, and a second p-channel MOS transistor having a second threshold, and having a gate coupled to the input, a drain coupled to the output, and a source coupled to the supply node through which the output is pulled to the supply voltage when the input is below the second threshold voltage;

an input driver coupled between the supply node and the input to the output driver, the input driver comprising a circuit which tracks changes in the supply potential;

a n-channel MOS transistor having a gate and source coupled to the input of the output driver and a drain coupled to the supply node, having a third threshold less than the first threshold by at least 1 volt, which clamps the input to the output driver at a driver-ready level below the first threshold when the supply potential is at the power down level; and a feedback p-channel MOS transistor having a gate coupled to the output of the output driver, a drain coupled to the input of the output driver, and a source coupled to the supply node, and having a fourth threshold greater than the second threshold, which pulls the input of the output driver to a driver-off level above the second threshold when the output of the output driver is below the fourth threshold.

* * * * *